United States Patent
Su et al.

(10) Patent No.: US 6,437,429 B1
(45) Date of Patent: Aug. 20, 2002

(54) SEMICONDUCTOR PACKAGE WITH METAL PADS

(75) Inventors: Chun-Jen Su; Chien-Hung Lai; Chien-Tsun Lin; Chao-Chia Chang; Yu-Hsien Su; Ming-Hui Tseng, all of Kaohsiung (TW)

(73) Assignee: Walsin Advanced Electronics Ltd (TW)

( * ) Notice: Subject to any disclaimer, the term of this patent is extended or adjusted under 35 U.S.C. 154(b) by 0 days.

(21) Appl. No.: 09/852,641

(22) Filed: May 11, 2001

(51) Int. Cl.[7] .................. H01L 23/495; H01L 23/28
(52) U.S. Cl. .............. 257/666; 287/696; 287/787; 287/784
(58) Field of Search .................. 257/666, 787, 257/783, 678, 784, 693, 675, 796, 696; 438/123; 361/813

(56) References Cited

U.S. PATENT DOCUMENTS

| | | | |
|---|---|---|---|
| 6,143,981 A | 11/2000 | Glenn | 174/52.4 |
| 6,198,171 B1 * | 3/2001 | Huang et al. | 257/787 |
| 6,204,554 B1 * | 3/2001 | Ewer et al. | 257/705 |
| 6,208,023 B1 * | 3/2001 | Nakayama et al. | 257/696 |
| 6,211,462 B1 * | 4/2001 | Carter et al. | 174/52.4 |
| 6,281,568 B1 * | 8/2001 | Glenn et al. | 257/684 |
| 6,294,830 B1 * | 9/2001 | Fjelstad | 257/724 |

* cited by examiner

Primary Examiner—Jasmine J B Clark
(74) Attorney, Agent, or Firm—Troxell Law Office PLLC

(57) ABSTRACT

A semiconductor package is disclosed, such as QFN, SON. The semiconductor package includes a die, a package body for protection of a die, and a plurality of leads. A metal pad formed by some partial downside surface of each lead is located on a downside surface of the package body with coplanarity. Each lead has a cutting surface exposed on a corresponding lateral surface of the package body. The cutting surface has an interval with the plane of forming the metal pads by means of selectively self-etching the leads or stamping to bend the leads in order to avoid forming a cutting sharp edge in the brim of the metal pad after cutting.

12 Claims, 7 Drawing Sheets

US 6,437,429 B1

SEMICONDUCTOR PACKAGE WITH METAL PADS

FIELD OF THE INVENTION

The present invention relates to a semiconductor package with metal pads replacing of the outer leads, such as QFN, SON package structure, and especially to a semiconductor package with metal pads that there is an interval between a metal pad and corresponding cutting surface for avoiding the formation of a sharp edge.

BACKGROUND OF THE INVENTION

Conventional semiconductor device includes a die protected from injury of the hostile environment by using a package body to seal, and a lead frame (leads) for electrically connecting the die of the semiconductor package to a printed circuit board, such as Quad Flat Package, QFP with outer leads around the package body or Small Outline Package, SOP with outer leads at the both sides of the package body.

With small size of the semiconductor package, a semiconductor package with metal pads replacing of outer leads brought up from U.S. Pat. No. 6,143,981 "Plastic Integrated Circuit Package And Method And Lead frame For Making The Package" may decrease the surface footprint. FIG. 1 and FIG. 3 are cross sectional view and side view of a semiconductor package 100 respectively. As shown in FIG. 2, a lead frame 170 is going to encapsulate the semiconductor package 100. The lead frame 170 has a plurality of frames 171, each frame 171 connects a die pad 130 and a plurality of leads 140 facing the die pad 130. After sticking a die 110 on the die pad 130, electrically connect the bonding pads of the die 110 to topside surfaces of the leads 140 with bonding wires. Then there is a package body 120 (or called encapsulant material) formed by molding, injection and baking to seal the die 110, bonding wires 150, and the topside surfaces 141 of the leads 140, but to expose the downside surfaces 142 (metal pads) of the leads 140 in which use of outer electrical connection of the semiconductor package. After electroplating the downside surfaces 142 of leads 140, a plurality of whole semiconductor packages 100, such as Quad Flat Non-leaded package, QFN or Small Outline Non-leaded package, SON, may be gained through cutting the leads 140 along the package body 120. However, as shown in FIG. 3, the cutting surfaces 143 of leads 140 on the lateral surface of package body 120 are adjacent to downside brim of package body 120 and connect with the downside surface 142 of the corresponding leads 140 (as shown in FIG. 1). It is easy to form a sharp edge at the brim 144 of downside surface 142 of leads 140 so that it may affect the coplanarity of the downside surface 142 of leads 140 and results in a surface-mounting fail with a printed circuit board.

SUMMARY OF THE INVENTION

The first object of the present invention is to provide a semiconductor package with metal pads, each metal pad is formed by partial downside surface of the corresponding lead, a plurality of metal pads are formed on a same plane. In order to avoid forming the cutting sharp edge at the brim of metal pads during cutting leads to affect the surface mounting and simultaneously enhance the fixing stability of the leads to the package body, an interval is formed between the cutting surface of the lead and the plane of forming metal pads by means of gap-etching or bend-stamping.

The second object of the present invention is to provide a leadframe for non-leaded semiconductor package. By using that all the cutting portions of the leads are higher than the metal pads on the downside surface of lead, the downside surfaces of leads between metal pads and cutting portions can be covered by the package body, therefore the cutting sharp edges may be avoided forming at the brims of metal pads.

According to the present invention, a semiconductor package with metal pads mainly comprises a die, a plurality of leads, a plurality of electrical connecting devices and a package body. The die has a topside surface with a plurality of bonding pads and a downside surface opposite to the topside surface. Each lead has a topside surface, a downside surface and a cutting surface. The electrical connecting devices, such as bonding wires, are to electrically connect the bonding pads of the die to the topside surface of the corresponding lead. The package body seals the topside surface of the die, the electrical connecting devices and the topside surfaces of the leads, but exposes the partial downside surfaces of leads to form the metal pads. There is an interval between the cutting surfaces and a plane that the metal pads are formed on for avoiding forming a sharp edge at the brim of the metal pad.

DETAILED DESCRIPTION OF THE PREFERRED EMBODIMENT

Figure 1:
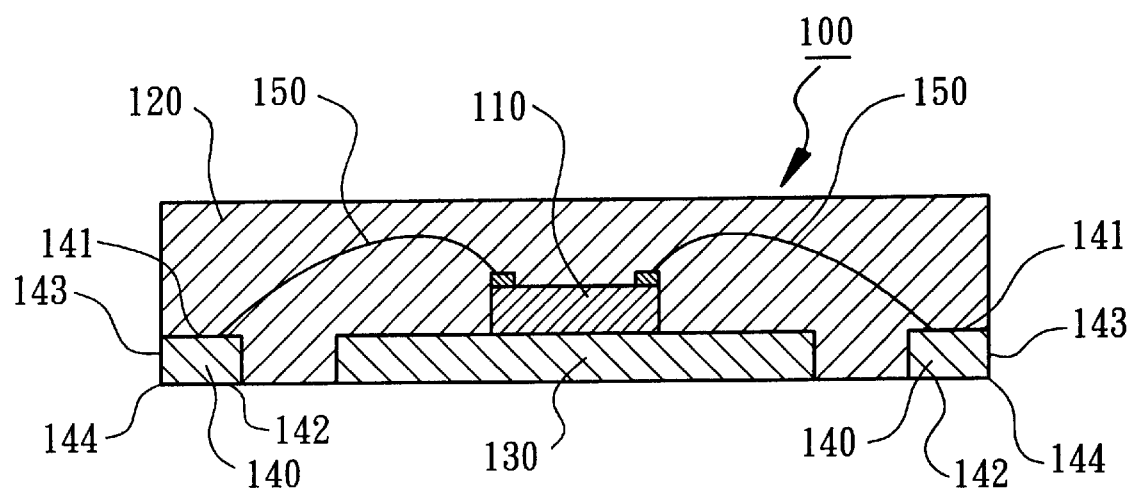
FIG. 1 is a cross sectional view of a completed semiconductor package disclosed in U.S. Pat. No. 6,143,981 "plastic integrated circuit package and method and lead frame for making the package".
Figure 2:
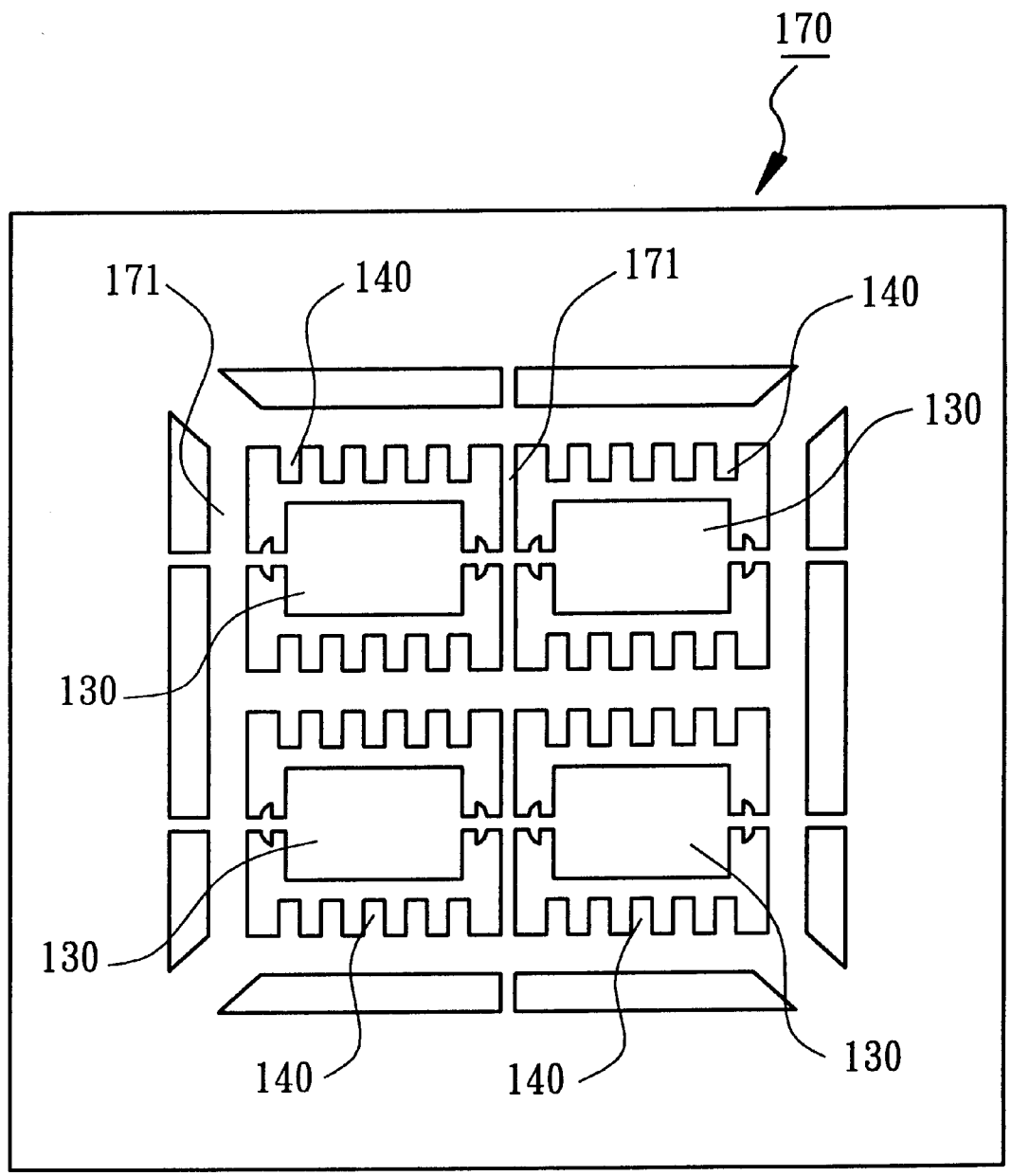
FIG. 2 is a top view of a lead frame disclosed in U.S. Pat. No. 6,143,981 "plastic integrated circuit package and method and lead frame for making the package".
Figure 3:
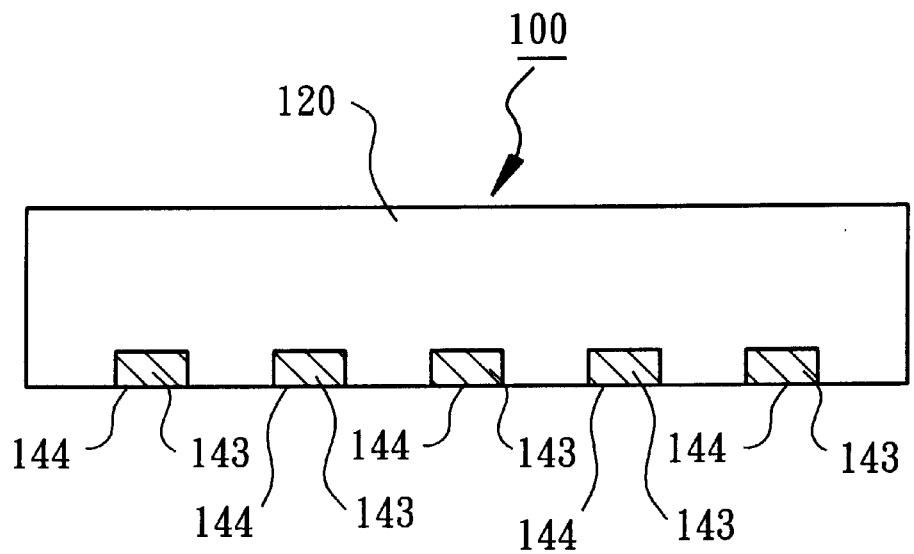
FIG. 3 is a side view of a completed semiconductor package disclosed in U.S. Pat. No. 6,143,981 "plastic integrated circuit package and method and lead frame for making the package".

Referring to the drawings, the present invention will be described by means of the embodiments.

Figure 4:
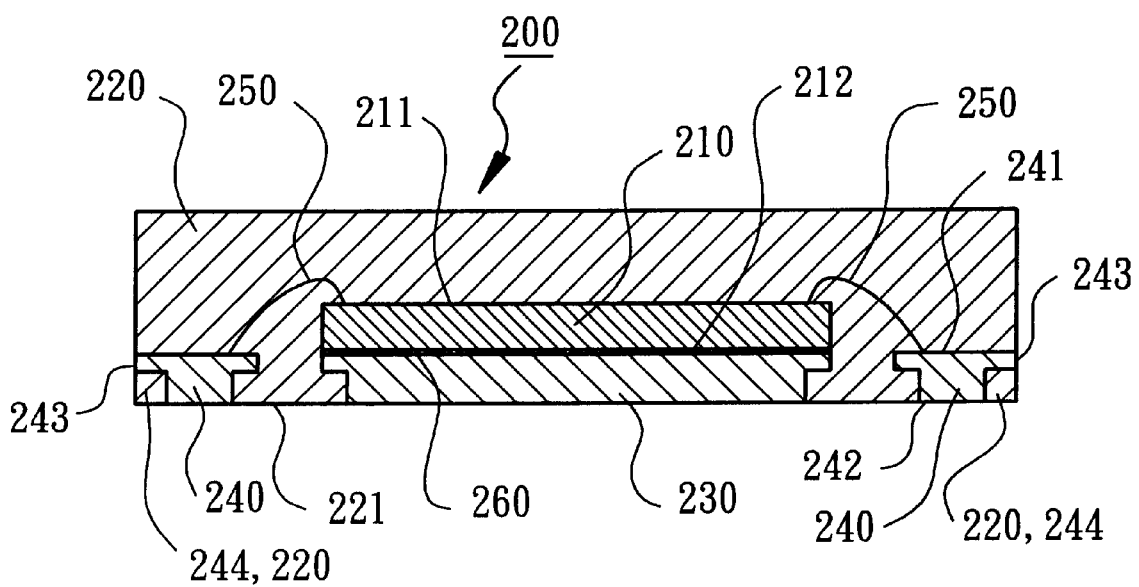
FIG. 4 is a cross sectional view of a semiconductor package with metal pads according to a first embodiment of the present invention.
Figure 5:
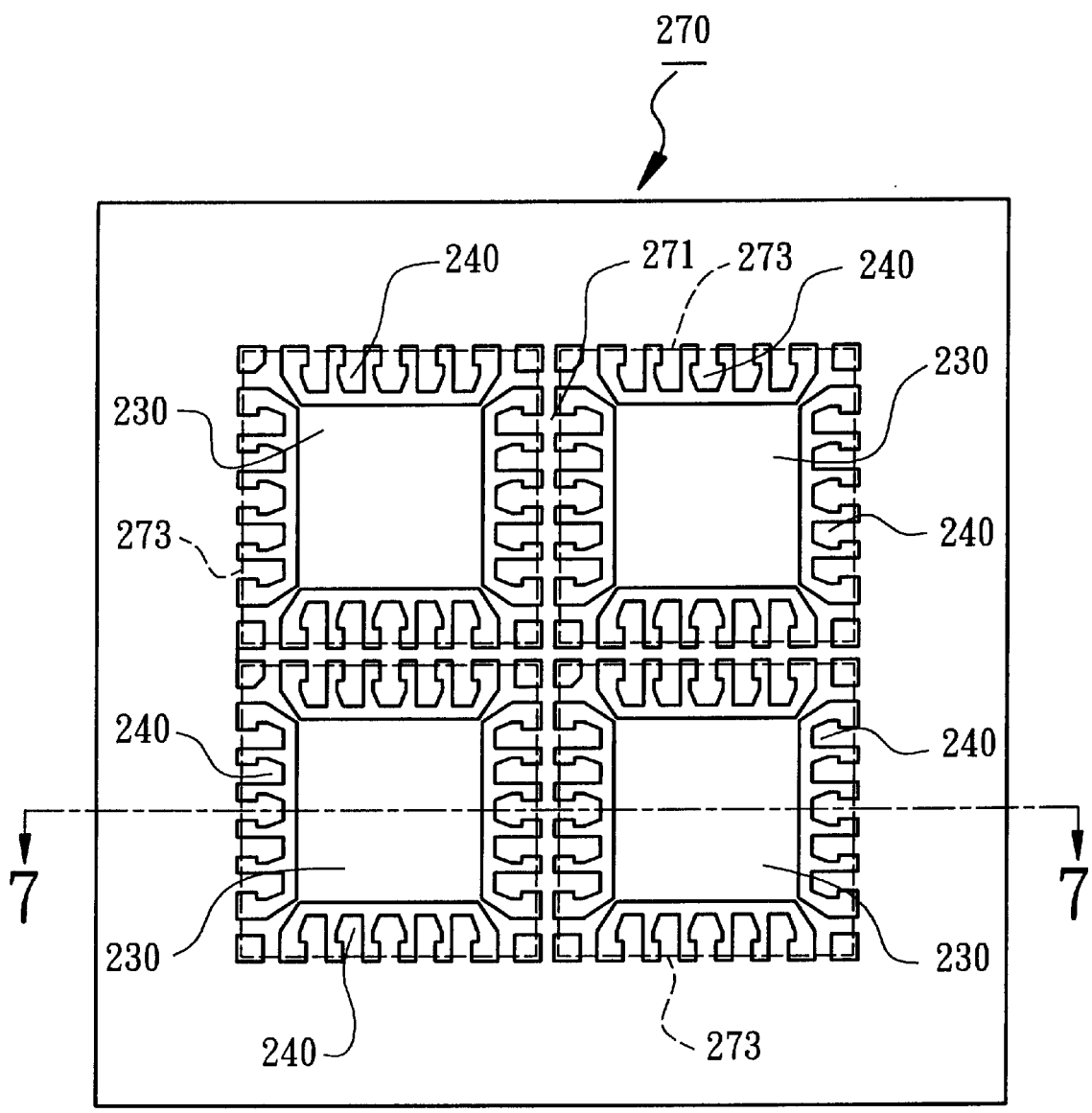
FIG. 5 is a top view of a lead frame of the semiconductor package with metal pads according to the first embodiment of the present invention.
Figure 6:
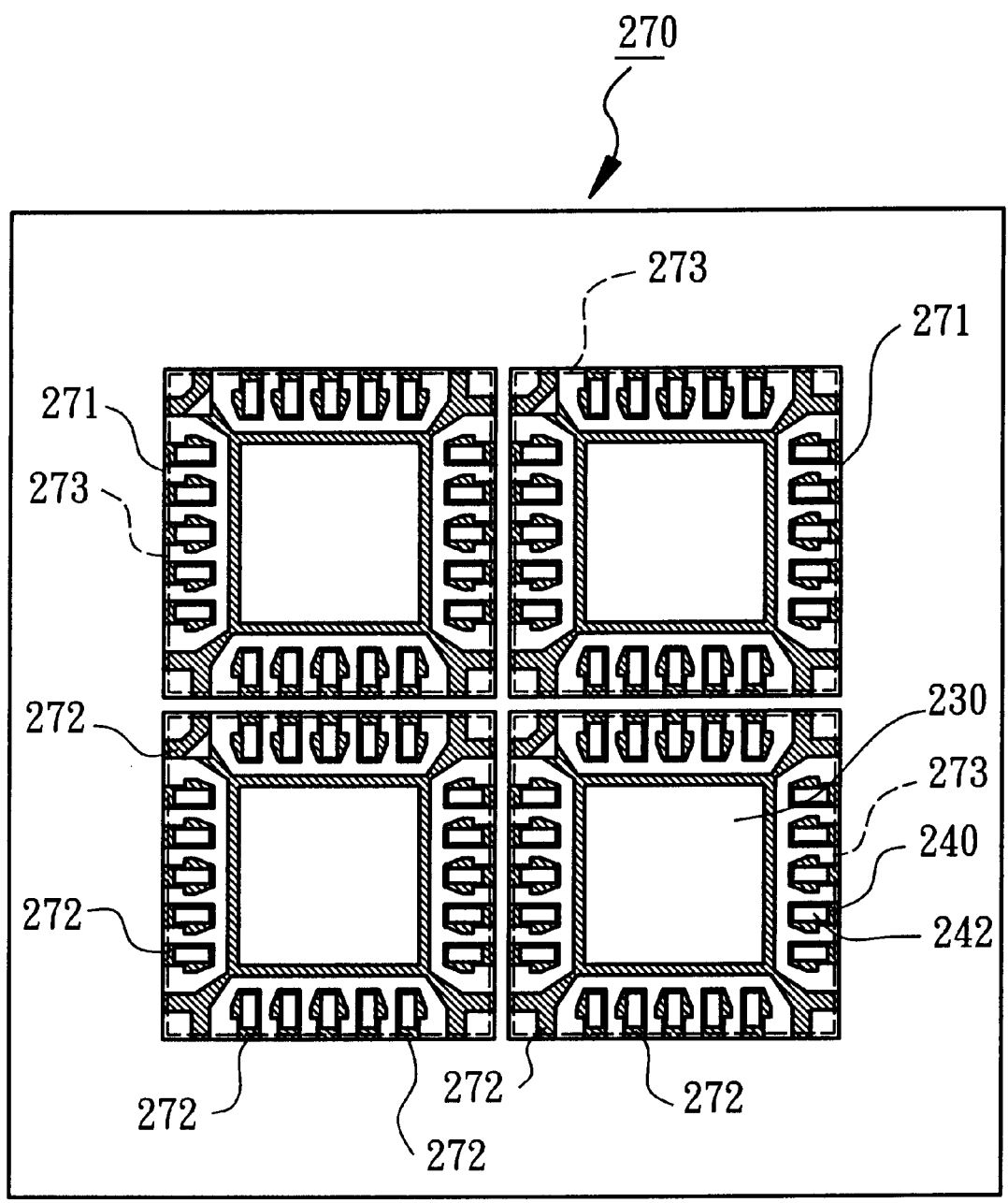
FIG. 6 is a bottom view of a lead frame of the semiconductor package according to the first embodiment of the present invention.
Figure 7:
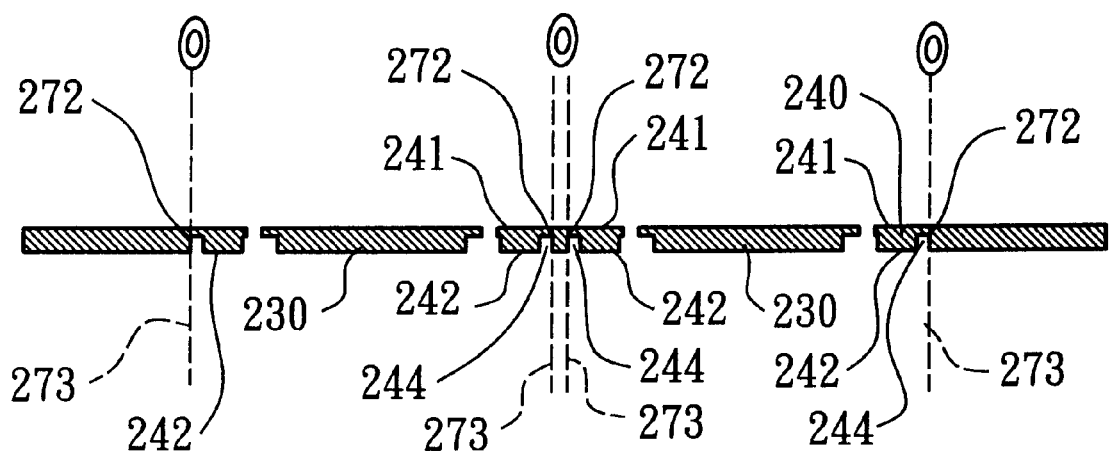
FIG. 7 is a cross sectional view of a lead frame of the semiconductor package along FIG. 5 line 7—7 according to the first embodiment of the present invention.
Figure 8:
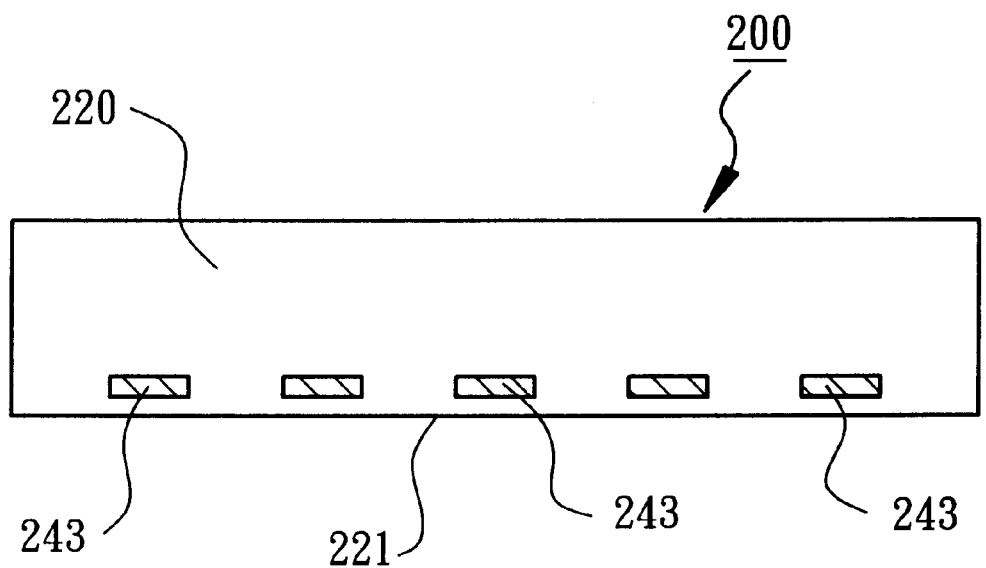
FIG. 8 is a side view of the semiconductor package according to the first embodiment of the present invention.

FIG. 4 and FIG. 8 show a first embodiment of the present invention, a semiconductor package 200 with metal pads mainly comprises a die 210, a package body 220 and a plurality of leads 240. FIG. 5, FIG. 6, and FIG. 7 show a provided lead frame 270 of forming the semiconductor package 200.

As shown in FIG. 4, the die 210 has a topside surface 211 forming a plurality of bonding pads and integrated circuit elements (not showed in the drawing), and a downside surface 212 opposite to the topside surface 211. The die 210 may be a memory chip, such as DRAM, SRAM and flash, etc, or microprocessor, or logic chip.

Each lead 240 has a topside surface 241, a downside surface and a cutting surface 243, wherein some partial downside surface of the lead 240 is defined to form a metal pad 242. The metal pads 242 of these leads 240 expose outside the package body 220 and form on a same plane for outer electrical connection of the semiconductor package 200. There is an interval, at least 0.1 mm, between each cutting surface 243 and the plane of forming the metal pads 242 so that partial downside surface of the lead 240 between the metal pads 242 and cutting surface 243 can be covered by a package body 220 for stronger bonding of the lead and the package. While cutting the leads 240 of a lead frame along the cutting surfaces 243, the cutting surface 243 does not adjoin the corresponding metal pad 242 by package body 220 so that the leads 240 are separated efficaciously from lead frame and also avoid a sharp edge forming at the brim of the metal pad 242 (as showed in FIG. 8). The interval at least 0.1 mm between the cutting surface 243 and the plane of forming metal pads 242 may prevent the metal pads 242 from forming cutting sharp edges and make sure that all the metal pads 242 are on the same plane. In this embodiment, in order to obtain an interval between the cutting surface 243 and the plane of forming metal pads 242, a selectively half-etching method is introduced to form a gap 244 on the downside surface of the lead 240 between the metal pads 242 and the cutting surface 243. Besides, the semiconductor package 200 includes a die pad 230 for fixing the die 210, by using an adhesive, such as liquid compound, silver compound or tape, etc adhering the downside surface 212 of the die 210 onto the die pad 230. The die pad 230 and the leads 240 are integrated into a same lead frame 270 (as showed in FIG. 5 and FIG. 6).

Besides, regarding to the inner electrical connection between the die 210 and the leads 240, a plurality of bonding wires 250 made of gold or copper material are formed by wire-bonding technique to connect the bonding pad on the topside surface 211 of the die 210 and the topside surface 241 of the corresponding lead 240. Certainly except the bonding wires 250 can be used to be an electrical interconnecting device of semiconductor package 200, the TAB lead (Tape Automated Bonding lead) also is an alternative for electrically connecting the die 210 and the lead 240.

The package body 220 is used to protect the die 210 from invasion of moisture or dust, it is a thermosetting insulator, consisted of epoxy compound, adhesive and silicon oxide filler and the others. The package body 220 makes the semiconductor package 200 become a brick outline without outer leads extending. By means of molding, injection and curing, the package body 220 seals the topside surface 211 of the die 210, the topside surfaces 241 of the leads 240, the bonding wires 250 and the downside surfaces of the leads 240 between the metal pads 242 and cutting surfaces 243 (that is the gap 244), but exposes the metal pads 242 on the downside surface of leads 240 and the cutting surfaces 243 of leads 240. In this embodiment, the metal pads 242 are exposed on the downside surface 221 of the package body 220 and are formed on a same plane. The cutting surfaces 243 are exposed on the lateral surfaces of the package body 220 with a horizontal arrangement, further each cutting surfaces 243 is not adjacent to the corresponding metal pads 242 directly. The interval formed between the cutting surface 243 and the plane of forming metal pads 242 prevents forming a sharp edge at the brim of metal pad 242 in order to keep the metal pads 242 on a same plane after cutting, and furthermore to increase the efficiency of surface mounting of metal pads upon a printed circuit board.

One of the main features of the present invention is the relative arrangement of the leads 240 and the package body 220, especially the interval between the cutting surfaces 243 of the leads 240 and the plane of forming metal pads 242 for being filled and covered by the package body 220. In order to make a better understanding, it is necessary to illustrate a lead frame 270 to form the leads 240 of the semiconductor package 200 in detail. As showed in FIG. 5, 6, 7, the lead frame 270 for the semiconductor package 200 mentioned above is made of a metal plate of thickness about 0.2 mm of copper, iron or alloy (alloy 42, including nickel 42% and iron 58%), etc by the method of stamping or etching. The lead frame 270 has a plurality of frames 271 (in this embodiment, four frames are shown for easily understanding, in fact more than four). In every frame 271 includes a semiconductor packaging area for forming one semiconductor package 200 mentioned above. Each semiconductor package area is adjacent to the cutting path 273. In each frame 271 connects a plurality of leads 240 and a die pad 230. The leads 240 pass through the cutting path 273 and extends into the semiconductor package area, each lead 240 has a topside surface 241 and a downside surface, wherein some partial downside surface are used to form a metal pads 242 with coplanarity. FIG. 6 shows the portion of light black which means to be carried out partial half-etching on the downside surface of the lead frame 270, in this embodiment, at least half of the thickness of the lead 240 (0.1 mm) is etched. FIG. 6–7 show the partial etching area 272 formed on the downside surface of the lead near to the outer end of corresponding lead 240 extending from the brim of metal pads 242 over the cutting path 273. After cutting the etching area 272 along the cutting path 273, the lead 240 has a upward hollow gap 244 (as shown in FIG. 4) at least 0.1 mm so that there is an interval between along the cutting path 273 formed between the cutting surfaces 243 of the leads 240 and the plane of forming metal pads when molding & encapsulating. Therefore the interval may be filled by the package body 220 in order to prevent forming the cutting sharp edge at the brim of metal pads 242.

Figure 9:
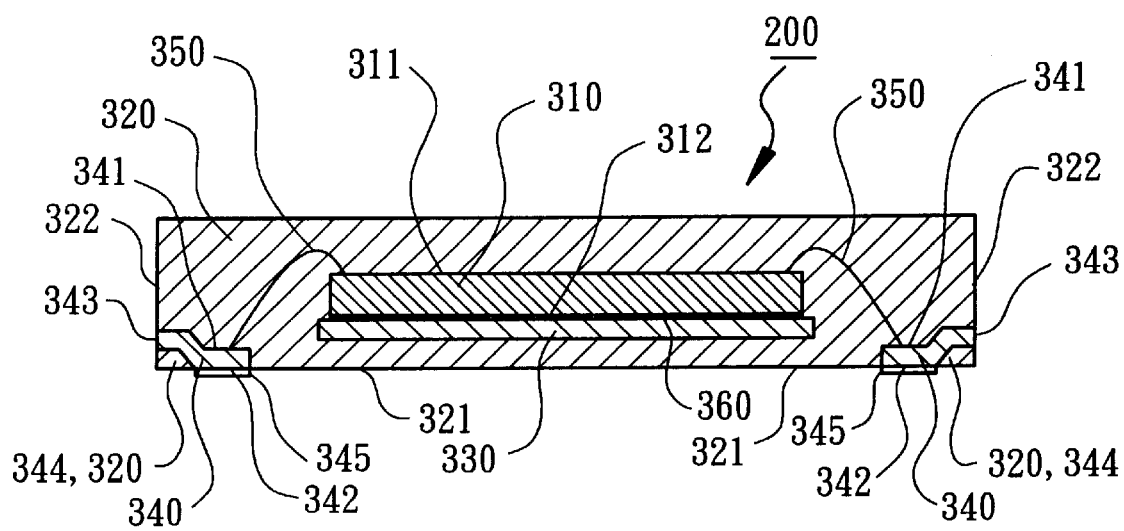
FIG. 9 is a cross sectional view of a semiconductor package according to a second embodiment of the present invention.

In another alternative, the semiconductor package of the present invention may use a lead frame manufactured by bending-stamping. FIG. 9 shows the second embodiment of the present invention, a semiconductor package 300 mainly comprises a die 310, a package body 320 and a plurality of leads 340. The die 310 has a topside surface 311 with a plurality of bonding pads and a downside surface 312. Each lead 340 has a bending portion 344 so that the inner end of the lead 340 (i.e., the end facing to the die 310) formed on a down-set area resulting in not only the downside surfaces of the inner ends of the leads 340 exposing outside the package body 320 to form the metal pads 342 on a common plane, but also an interval between the cutting surface 343 and the plane of forming the metal pads 342 can be formed. Therefore the downside surface of each lead 340 between the metal pad 342 and the cutting surface 343 can be sealed by the package body 320. Besides, a solder material 345, such as nickel, palladium, lead-tin, gold, silver, etc, is formed by electroplating or printing on the exposing surface of metal pads 342. By means of stamping to bend the inner ends of the leads 340 forming on a down-set area 344. Further the semiconductor package 300 includes a die pad 330, by using the adhesive film 360 or adhesive to adhere the downside surface 312 of die 310 to the die pad 330. The die pad 330 and the leads 340 are integrated in a same lead frame. The inner electrical interconnection of the die 310 and the leads 340 is using the bonding wires 350 to connect the bonding pads on topside surface 311 of the die 310 and the topside surface 341 of the corresponding lead 340. The package body 320 is used to protect the die 310. The semiconductor package 300, is a brick type package, mainly seals the topside surface 311 of the die 3 10, the topside surfaces 341 of the leads 340, the bonding wires 350, the die pad 330 and the downside surfaces of the leads 340 between the metal pads 342 and the cutting surfaces 343 by the package body 320, but exposes the metal pads 342 on the downside surfaces of the leads 340 and the cutting surfaces 343 of the leads 340. In this embodiment, the metal pads 342 are exposed on the downside surface 321 of the package body 320 and are formed on a same plane. Preferably, the cutting surfaces 343 are exposed on the lateral surfaces 322 of the package body 320 with a horizontal arrangement. The cutting surface 343 is not adjacent to the metal pads 342 directly, and there is an interval between the cutting surface 343 and the plane of forming metal pads 342 so that it avoids to form a sharp edge at the brim of the metal pad 342 after cutting and solves a defect that the metal pads 342 are not easily on the same plane after cutting, furthermore it enhances the efficiency of surface mounting to a printed circuit board.

Figure 10:
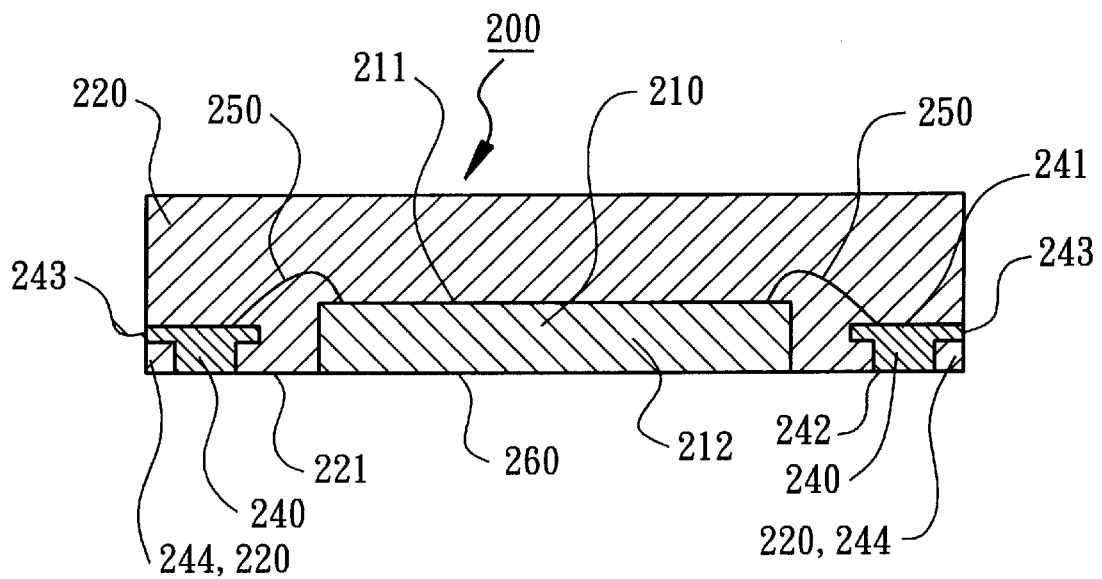
FIG. 10 is a cross sectional view of a semiconductor package according to a third embodiment of the present invention.

FIG. 10 is a cross-sectional view of the third embodiment of the present invention. In the semiconductor package of the third embodiment, the components same as in the first embodiment will be showed in the same number. The semiconductor package comprises a die 210, a package body 220, a plurality of leads 240 and bonding wires 250. The die 210, a plurality of leads 240 and bonding wire 250 are as same as in the first embodiment, but in the manufacturing process the die pad of a leadframe is replaced by a sacrificable tape so that the semiconductor package of the third embodiment has not only the same effect as the first embodiment does but also a thinner thickness and a better thermal dissipation.

The above description of embodiments of this invention is intended to be illustrative and not limiting. Other embodiments of this invention will be obvious to those skilled in the art in view of the above disclosure.

What is claimed is:

1. A semiconductor package comprising:
   at least a die, each die having a topside surface, a downside surface, and a plurality of bonding pads on the topside surface;
   a plurality of leads having a topside surface, a downside surface and a cutting surface;
   a plurality of electrical connecting devices electrically connecting the bonding pads of the die to the topside surfaces of the corresponding leads; and
   a package body sealing the topside surface of the die, the electrical connecting devices and the topside surfaces of leads, and exposing some partial downside surfaces of the leads on a same plane to form a plurality of metal pads and the cutting surfaces of the leads, wherein there is an interval between the cutting surface and the plane of forming the metal pads, the downside surface of each lead between the corresponding metal pad and the cutting surface is covered by the package body.

2. The semiconductor package of claim 1, wherein the interval is 0.1 mm at least.

3. The semiconductor package of claim 1, further comprising a die pad for fixing the die.

4. The semiconductor package of claim 1, wherein the electrical connecting devices are bonding wires.

5. The semiconductor package of claim 1, wherein the downside surface of each lead between the corresponding metal pad and the cutting surface has a gap.

6. The semiconductor package of claim 1, wherein each lead between the corresponding metal pad and the cutting surface has at least a bending portion so that the inner ends of the leads are formed on a down-set area.

7. The semiconductor package of claim 1, further comprising a solder material on each metal pad.

8. The semiconductor package of claim 1, wherein the cutting surfaces of leads are exposed on the lateral surfaces of the package body vertical to the plane of forming metal pads.

9. A lead frame for semiconductor package comprising:
   at least a frame, each frame including a semiconductor packaging area, and cutting paths around the brims of the semiconductor packaging area;
   a plurality of leads connecting with the frame integratedly, each lead passing through at least one cutting path and extending into the semiconductor packaging area, each lead having a topside surface and a downside surface, wherein some partial downside surfaces of the leads are formed on the same plane for forming the metal pads of a semiconductor package;
   a plurality of gaps, each formed on the downside surface of the corresponding lead from the brim of the metal pad extending over the corresponding cutting path so that there is an interval between the cutting surface of the lead along the cutting path and the plane of forming the metal pads.

10. The lead frame of claim 9, further comprising a die pad in each semiconductor packaging area for fixing a die.

11. A lead frame for semiconductor package comprising:
    at least a frame, each frame including a semiconductor packaging area, and cutting paths around the brims of the semiconductor packaging area;
    a plurality of leads connecting with the frame integratedly, each lead passing through at least one cutting path and extending into the semiconductor packaging area, each lead having a topside surface and a downside surface, wherein some partial downside surfaces of the leads formed on a same plane for
    becoming the metal pads of semiconductor package;
    a down-set area formed by the inner ends of the leads, the downside surface of the inner end of each lead being a metal pad on a same plane, wherein there is an interval between the cutting surface of the lead along the cutting path and the plane of forming the metal pads.

12. The lead frame of claim 11, further comprising a die pad in each semiconductor package area for fixing a die.

* * * * *